(12) United States Patent
Jansen et al.

(10) Patent No.: US 9,448,300 B2
(45) Date of Patent: Sep. 20, 2016

(54) SIGNAL-BASED DATA COMPRESSION

(71) Applicant: NXP B.V., Eindhoven (NL)

(72) Inventors: Feike Jansen, Eindhoven (NL); Zoran Zivkovic, Hertogenbosch (NL)

(73) Assignee: NXP B.V., Eindhoven (NL)

( * ) Notice: Subject to any disclaimer, the term of this patent is extended or adjusted under 35 U.S.C. 154(b) by 217 days.

(21) Appl. No.: 14/288,670

(22) Filed: May 28, 2014

(65) Prior Publication Data

US 2015/0346321 A1 Dec. 3, 2015

(51) Int. Cl.

| | |
|---|---|
| *G01S 13/02* | (2006.01) |
| *G01S 7/02* | (2006.01) |
| *G01S 7/00* | (2006.01) |
| *G01S 7/295* | (2006.01) |
| *G01S 13/34* | (2006.01) |
| *H03M 7/30* | (2006.01) |
| *G01S 7/35* | (2006.01) |
| *G01S 13/93* | (2006.01) |

(52) U.S. Cl.
CPC ................. *G01S 7/02* (2013.01); *G01S 7/003* (2013.01); *G01S 7/295* (2013.01); *G01S 7/352* (2013.01); *G01S 13/02* (2013.01); *G01S 13/34* (2013.01); *H03M 7/30* (2013.01); *G01S 13/931* (2013.01); *G01S 2007/356* (2013.01); *G06F 2212/401* (2013.01)

(58) Field of Classification Search
CPC ...... G01S 13/02; G01S 13/34; G01S 13/931; G01S 2007/356; G01S 7/003; G01S 7/02; G01S 7/295; G01S 7/352; G06F 17/10; G06F 2212/401; H03M 7/30
USPC ................................ 342/104, 107, 118, 175
See application file for complete search history.

(56) References Cited

U.S. PATENT DOCUMENTS

| | | | |
|---|---|---|---|
| 4,005,417 A | * | 1/1977 | Collins ................... G01S 13/53 324/76.23 |
| 5,638,281 A | | 6/1997 | Wang |
| 5,661,477 A | | 8/1997 | Moreira et al. |

(Continued)

FOREIGN PATENT DOCUMENTS

| | | |
|---|---|---|
| CN | 101299611 A | 11/2008 |
| JP | 7-035844 A | 2/1995 |
| JP | 11-83623 A | 7/1999 |
| WO | 2006/052122 A1 | 5/2006 |
| WO | 2010092491 A2 | 8/2010 |

OTHER PUBLICATIONS

Lakshmanan, V. "Overview of Radar Data Compression", Proc. of SPIE, vol. 6683, 5 pgs., Retrieved from the Internet at: http://proceedings.spiedigitallibrary (Oct. 21, 2015).

(Continued)

*Primary Examiner* — Timothy A Brainard
(74) *Attorney, Agent, or Firm* — Rajeev Madnawat

(57) ABSTRACT

Aspects of the present disclosure are directed to apparatuses and methods involving the detection of signal characteristics. As may be implemented in accordance with one or more embodiments, an apparatus includes a radar or sonar transceiver that transmits signals and receives reflections of the transmitted signals. A data compression circuit determines a compression factor based on characteristics of the signals, such as may relate to a channel over which the signal passes and/or related aspects of an object from which the signals are reflected (e.g., velocity, trajectory and distance). Data representing the signals is compressed as a function of the determined compression factor.

29 Claims, 15 Drawing Sheets

(56) References Cited

U.S. PATENT DOCUMENTS

| | | | |
|---|---|---|---|
| 5,923,285 A * | 7/1999 | Andrusiak | G01S 7/003 342/177 |
| 7,773,032 B2 * | 8/2010 | Feria | G01S 7/295 342/159 |
| 2003/0156054 A1 | 8/2003 | Ishii et al. | |
| 2005/0063382 A1 * | 3/2005 | Fenner | H03M 7/4006 370/389 |
| 2006/0064206 A1 | 3/2006 | Merkel et al. | |
| 2008/0234982 A1 * | 9/2008 | Allen | G06T 5/50 702/190 |
| 2009/0046002 A1 * | 2/2009 | Tsunoda | G01S 7/4004 342/167 |
| 2009/0237292 A1 * | 9/2009 | Tigrek | G01S 13/28 342/109 |
| 2012/0206292 A1 * | 8/2012 | Boufounos | G01S 13/9035 342/25 A |
| 2013/0242701 A1 | 9/2013 | Karl | |
| 2013/0249730 A1 * | 9/2013 | Adcook | G01S 13/87 342/22 |
| 2013/0342383 A1 * | 12/2013 | Kojima | G01S 13/10 342/134 |
| 2014/0120966 A1 * | 5/2014 | Fischer | H04K 3/822 455/500 |

OTHER PUBLICATIONS

Puhakka, T. et al. "On the Compression of Digital Radar Date*)'", University of Helsinki, Dept. of Meteorology, 16 pgs. (1980).

McCarroll, S. et al. "Approaches for Compression of Super-Resolution WSR-88D Data", IEEE Geoscience and Remote Sensing Letters, vol. 8, No. 2, pp. 191-195 (Mar. 2011).

Extended European Search Report for EP Patent Appln. No. 15168761.3 (Oct. 29, 2015).

A.G. Stove: "Linear FMCW radar Techniques", IEE Proceedings-F, vol. 139, No. 5, Oct. 1992.

* cited by examiner

- Example implementation: objects on potential collision course will have positive velocity v. Time to collision is $t_{collision} = distance/velocity$.

SIGNAL-BASED DATA COMPRESSION

Aspects of various embodiments are directed to methods, apparatuses and systems involving radar-based signals.

Radar-based systems have been used in a multitude of applications, including vehicle applications, military applications, and others. Generally, the distance that a radar signal, such as sound, light or other radiation, travels is used to characterize the environment. For instance, the round-trip distance that a radar signal travels from a transmitter to an object and back to a receiver can be determined based upon characteristics of the signal and the medium in which the signal travels.

Using an automobile as an example, a signal can be modulated according to a specific waveform principle (e.g., a frequency modulated continuous wave (FMCW) signal), transmitted at a predetermined carrier frequency, and reflected signals are detected and used to determine a distance to an object. Such an approach can be used, for example, for sensing distance to another parked vehicle, or sensing a velocity at which an object is approaching the vehicle, as well as he angle between the object and the vehicle.

While such approaches have been very useful, many radar systems, such as automotive radar systems, combine a high resolution with a long measurement range. For instance, multiple antennas may be used to increase angular resolution, with multiple consecutive measurements used to extract what are often slow Doppler effects related to the speed of object movement. This approach may result in a high number of data points, which can require high processing power and high memory capacity. Another reason for large memory requirements is that large differences in received power of objects close by, and a related noise floor, may require a high number of bits for analog to digital conversion, and for optimizing a related signal to noise ratio (e.g., due to narrowband properties of received signals further reducing the noise bandwidth). These and other matters have presented challenges to radar-based implementations, for a variety of applications.

Various example embodiments are directed to radar-based methods, circuits and their implementation.

According to an example embodiment, an apparatus includes a radar transceiver that transmits radar signals and receives reflections of the transmitted radar signals over a communication channel (e.g., over air). A data compression circuit determines a compression factor based on characteristics of the transmission, and compresses data representing the radar signals as a function of the determined compression factor. The characteristics of the transmission may, for example, relate to one or more of channel loss, velocity of an object from which the reflections are received, or trajectory of such an object. Further, such characteristics may pertain to Doppler Effect aspects of the object and the signals (e.g., as may pertain to distance-related aspects). A data generator circuit generates an output signal including the compressed data. Various embodiments are directed to a method or methods using such approaches.

In another embodiment, data is compressed based upon predictability in the Doppler or multiple-antenna spectrum. A radar signal is converted to a representation in which an object is separated in distance, and a predictive model is used to predict further measurements. This model may, for example, be learned from the object at hand, or by using another object with relevant data stored for later access. The differences between the predicted and actual measurements are encoded, facilitating desirable compression ratios. Such a predictive model may, for example, be implemented with one or more embodiments herein, in which transmission/channel characteristics are used for processing.

Another embodiment is directed to an apparatus including a first circuit that detects signals reflected from an object, and a second circuit that determines a compression factor for the signals, based on characteristics of the object indicated via the signals. The characteristics are indicative of at least one of distance between the object and the first circuit, characteristics of a channel via which the signals are passed, velocity of the object relative to the first circuit, and trajectory of the object relative to the first circuit. A third circuit generates digital data based on the detected reflected signals, compresses the digital data as a function of the determined compression factor, and generates an output signal based on the compressed data.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
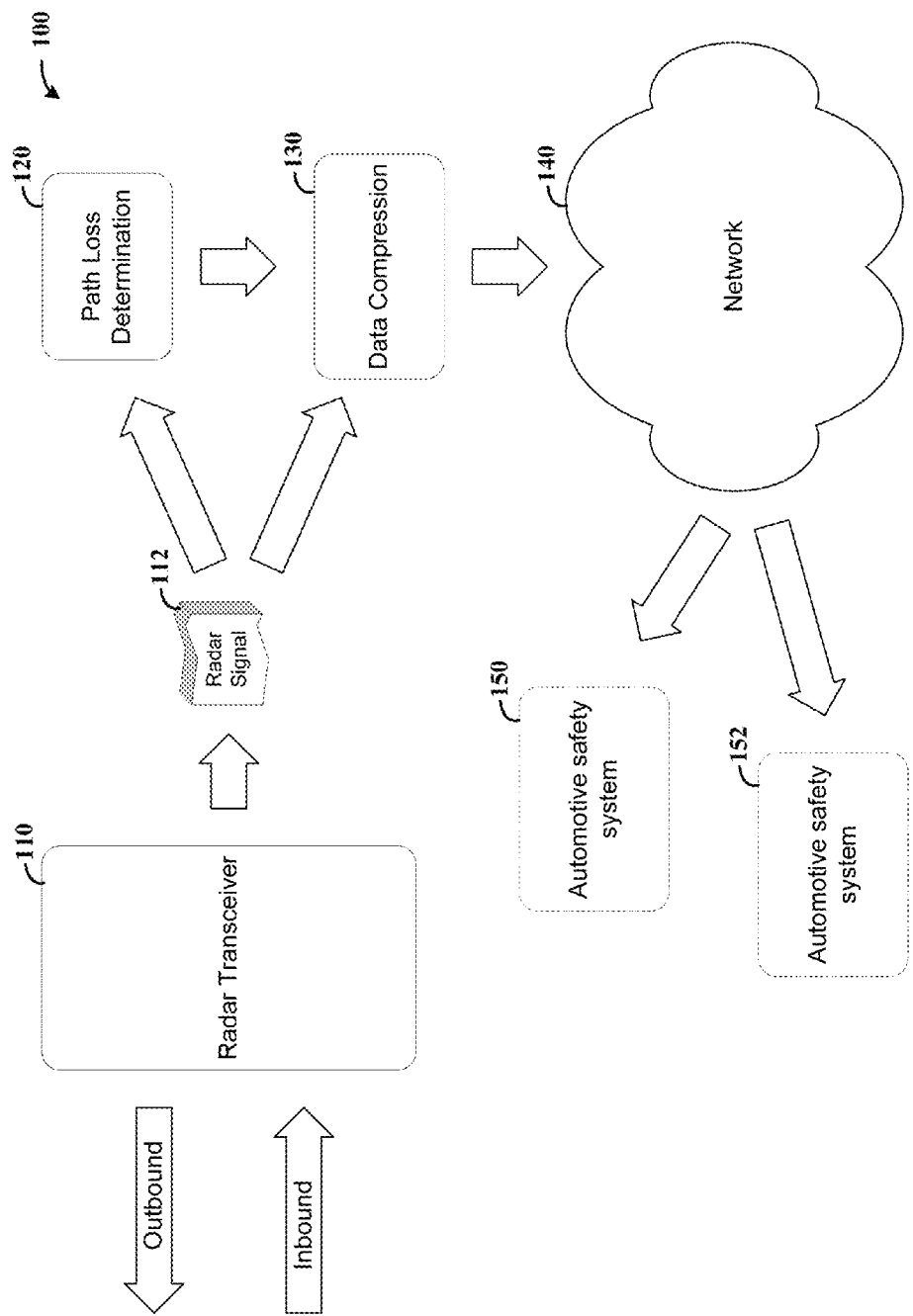
FIG. 1 shows an apparatus and approach for radar data processing, in accordance with an example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving radar-type implementations. While not necessarily so limited, various aspects may be appreciated through a discussion of examples using this context.

Various example embodiments are directed to methods, apparatuses and systems involving data compression of radar-based signals, in which the compression is based upon characteristics of a signal path via which the radar-based signals are passed. In some implementations, the compression is based upon one or more of distance to an object from which the radar-based signals are reflected, path loss, and amount of data representing the signals. These approaches may, for example, be implemented with a variety of radar-based systems such as frequency modulated continuous wave (FMCW) and pulse-based radar systems used in automotive applications such as automatic cruise control, parking aids and blind spot detection systems.

In a more particular embodiment, an automotive radar integrated circuit (IC) includes an embedded data compression circuit/module that represents original radar data with fewer bits than in the original data, based on measured radio channel characteristics over which radar signals are passed. These characteristics can be measured, for example, from a dedicated test signal or from the radar data itself.

In some implementations, a memory addressing technique is implemented for storing the data of a matrix (multidimensional array) with digital values represented with different precision in transposed form and other forms, which facilitate efficient memory reading for multidimensional data array processing. Such an approach can be used with two-dimensional (2D) or three-dimensional (3D) Fast Fourier Transform (FFT).

Various embodiments are directed to addressing challenges, including those discussed in the background above, and to addressing memory and processing requirements as may be related to high dynamic range radar signals, and FFT calculations that may require measurement samples to be kept in memory, via data compression. Embodiments are directed to one or more of the following aspects: an automotive radar system with embedded data compression (lower memory area or more effective memory space usage in same area; an embedded compression sub-system that represents original data with fewer bits; and calculating which bits of original digital radar data are kept and which are discarded. Radar data is compressed by: compressing radar data based on measured radio channel characteristics (e.g., upon path loss effect); transforming raw radar data into a representation in which data points are related to the distance from the radar (e.g., a first FFT operation in 2D/3D FFT processing) and compressing the transformed data; compressing data based upon a mean absolute value and variance of the absolute value of an FFT output; storing and addressing data of a matrix/multidimensional array with digital values represented with different precision in transposed form and other forms enabling efficient memory reading for multidimensional data array processing (e.g., 2D or 3D FFT); addressing memory to facilitate read-out of compressed digital values; decompressing data by converting compressed digital values into an original precision of the digital values; and compressing received signals by analyzing a test signal and/or a first part of the received signals.

In accordance with another example embodiment, an apparatus includes a radar transceiver that transmits radar signals and receives reflections of the transmitted radar signals over a communication channel, and a data compression circuit that determines a compression factor based on distance characteristics of the channel. For instance, the compression factor may be determined using a test signal transmitted via the radar transmitter, or a first/beginning portion of a received signal (and then later used to compress further portions of the received signal). The data compression circuit further compresses data representing the radar signals based on the determined compression factor, and a data generator circuit generates an output signal including the compressed data.

The data compression circuit operates in a variety of manners, to suit particular applications. In some implementations, for each transmitted radar signal and a received reflection thereof, data is compressed via lossy compression based on the radar signal, path loss in the communication channel, distance between the radar transceiver and an object from which the radar signal is reflected, and expected compression loss during the compression of the data by the data compression circuit.

In various embodiments, data is compressed based upon distance characteristics including Doppler Effect characteristics of transmitted radar signals. For instance, velocity of an object from which the transmitted radar signals are received can be determined using the Doppler Effect characteristics, and the compression factor can be based upon the determined velocity. In another implementation, the Doppler Effect characteristics are used to determine a probability that an object from which the transmitted radar signals are received will collide with a vehicle to which the radar transceiver is coupled. The compression factor is determined based upon the probability. In a more particular implementation, the data compression circuit determines a probability that an object from which the transmitted radar signals are received will collide with a vehicle to which the radar transceiver is coupled, based upon at least one of velocity of the object, distance of the channel, and angle at which the object is travelling relative to the vehicle. The compression factor is based upon the determined probability.

In some embodiments, the data compression circuit operates with the radar transceiver to transform received reflections of transmitted radar signals into data representing the radar signals, in which the data has data points that are based on a distance of respective objects from which the transmitted radar signals are reflected, relative to the radar transceiver. In some instances, the received reflections of the transmitted radar signals are transformed by carrying out a Fast Fourier transform (FFT) operation. For instance, the data can be compressed based upon a mean absolute value and variance of an absolute value of an output of the FFT operation.

In another embodiment, the data compression circuit compresses the data by transforming a quantization level of the data to a lower quantization level, for reflections of the transmitted radar signals from each of a plurality of objects. This transformation is carried out based on the distance of each object from the radar transceiver. The data compression circuit operates in another embodiment to determine path loss characteristics of the communication channel based upon a distance between the transceiver and objects from which the radar signals are reflected, and compresses the data based upon the determined path loss. In another embodiment, the data compression circuit uses lossy compression, predicts an offset address based on distance characteristics of the channel, and stores the compressed data using a transpose write operation and the predicted offset address.

In a more particular embodiment, the data compression circuit applies a Fourier transform to data representing the received reflections of the transmitted radar signals, therein providing transformed data that is mapped to a distance of objects from which the reflections are received. For each transmitted radar signal, the compression factor is determined, data representing the radar signal is compressed based upon the determined compression factor, and the compressed data is stored at memory addresses accessible by a vector of values for each memory access. In some implementations, the data compression circuit stores the compressed data at the memory addresses by storing the compressed data in a multidimensional array, with at least some of the compressed data stored in transposed form.

The compressed data is stored in memory in a variety of manners. In some embodiments, memory storage is allocated to different sets of data based upon the distance characteristics of the channel. In other embodiments, a probability that an object from which the transmitted radar signals are received will collide with a vehicle to which the radar transceiver is coupled is determined, based upon at least one of velocity of the object, distance of the channel, and angle at which the object is travelling relative to the vehicle. The compressed data is stored in memory by allocating memory storage to the set of data based upon the probability.

A variety of communication channels may be used. The communication channel may, for example, refer to an air-based channel via which radar or other signals (e.g., sonar) pass when being transmitted to and/or reflected from an object. In some embodiments, the channel extends from the radar transceiver to an object that provides the reflections of the transmitted radar signals, and back to the transceiver. The output signal is generated and transmitted using a communications protocol and network that is separate from the communication channel over which the radar signals and reflections are transmitted and received.

Another embodiment is directed to an apparatus including a first circuit that detects signals reflected from an object, and a second circuit configured and arranged to determine a compression factor for the signals based on characteristics of the object indicated via the signals. The characteristics are indicative of at least one of distance between the object and the first circuit, characteristics of a channel via which the signals are passed, velocity of the object relative to the first circuit, and trajectory of the object relative to the first circuit. A third circuit generates digital data based on the detected reflected signals, compresses the digital data as a function of the determined compression factor, and generates an output signal based on the compressed data. In some implementations, the compression factor is based upon signal loss characteristics of the channel via which the signals are passed. In other implementations, the compression factor is based upon relative movement of the object detecting using Doppler Effect characteristics of the object.

Various embodiments are directed to methods of implementing apparatuses as described or shown herein. In some embodiments, a compression factor is determined using Doppler Effect characteristics of transmitted signals, such as by determining velocity of an object, which may further involve predicting a probability that an object will collide with a vehicle (e.g., based on distance, velocity and/or trajectory). Further, data may be stored in memory based on such a probability, with memory being allocated to different sets of data accordingly (e.g., more memory may be allocated to data pertaining to higher risk objects, such as those travelling at high velocity, those that are close, and those having a trajectory that indicates a vehicle collision). In a more particular implementation, a probability that an object from which the transmitted signals are received will collide with a vehicle to which the radar transceiver is coupled is determined based upon at least one of velocity of the object, distance of the channel, and angle at which the object is travelling relative to the vehicle. Compressed data is stored in memory by allocating memory storage to the set of data based upon the probability.

Turning now to the figures, FIG. 1 shows an apparatus 100 and approach for radar data processing, in accordance with an example embodiment. The apparatus 100 includes a radar transceiver 110 that transmits (outbound) radar signals, and detects (inbound) reflections of those signals off of remote objects. Based on these detected reflections, the radar transceiver 110 provides radar signal 112 to a path loss determination block 120 and data compression block 130 (e.g., implemented as circuits). The path loss determination block 120 determines path loss characteristics of the path via which the reflections of the radar signals pass (and in some instances, indicative of a path via which the transmitted radar signals pass to the respective object or objects).

Once path loss characteristics have been determined, the data compression block 130 uses those characteristics in compressing the radar signal 112 (or a representation thereof), and transmits the compressed signal on a network 140. Such a network may, for example, be an in-vehicle network for an automobile or other vehicle, such as a wired network. Further, as represented by way of example, the transmitted compressed signal may be used for a variety of safety operations, such as with automotive safety systems 150 and 152. Such an approach may be implemented, for example, to present distance information to an alarm system indicative of an object in the path of a vehicle, or to a braking system for automatic braking.

Various embodiments described herein may be combined in certain embodiments, and various aspects of individual embodiments may be implemented as separate embodiments. For instance, aspects of FIG. 1 may be implemented with approaches as shown in FIGS. 3-6 with regard to discarding bits and related compression. Aspects of FIG. 2 may be implemented with specific approaches to implementing the data compression aspects of FIG. 1.

Figure 2:
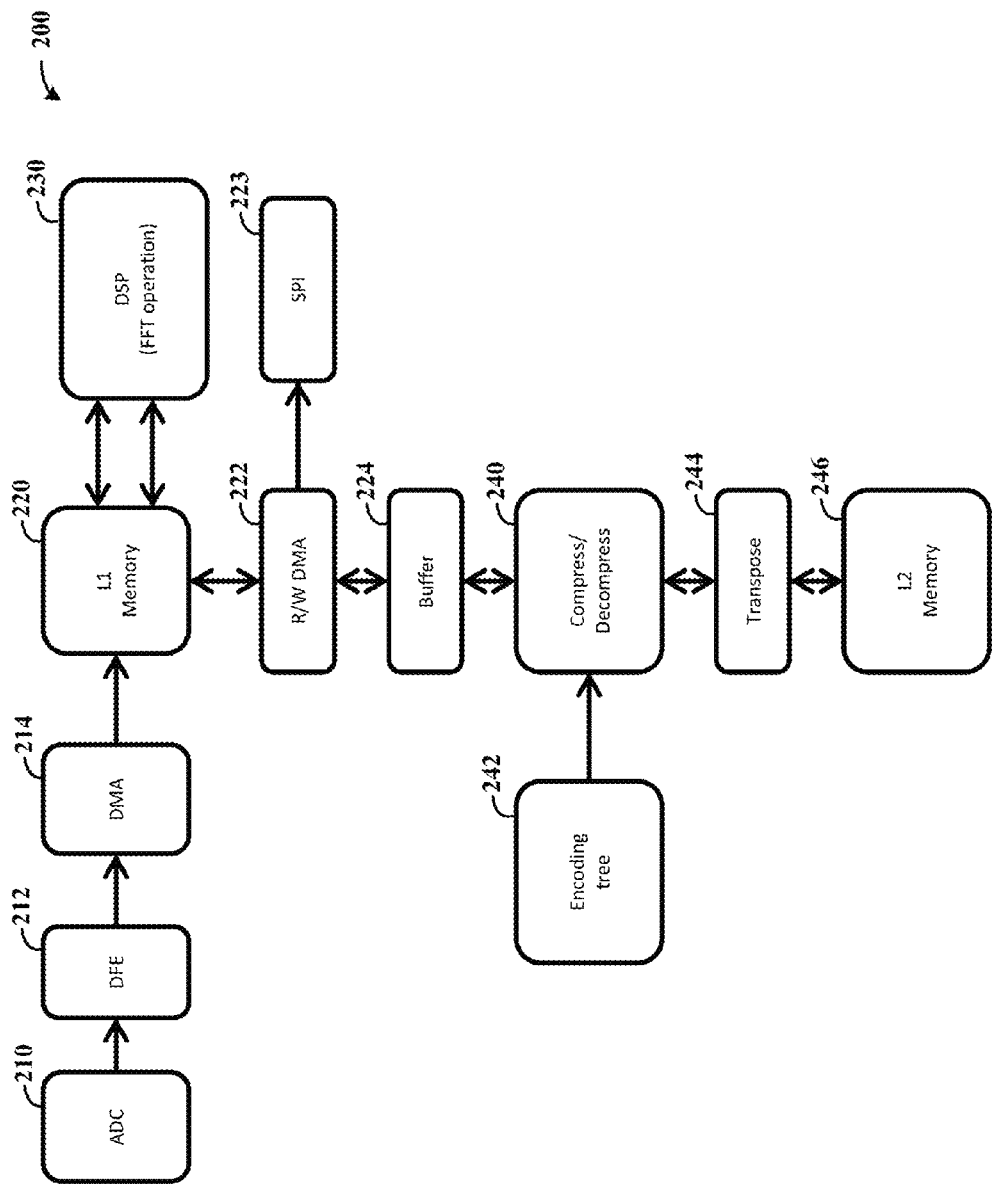
FIG. 2 shows a radar apparatus, in accordance with another example embodiment.
Figure 3:
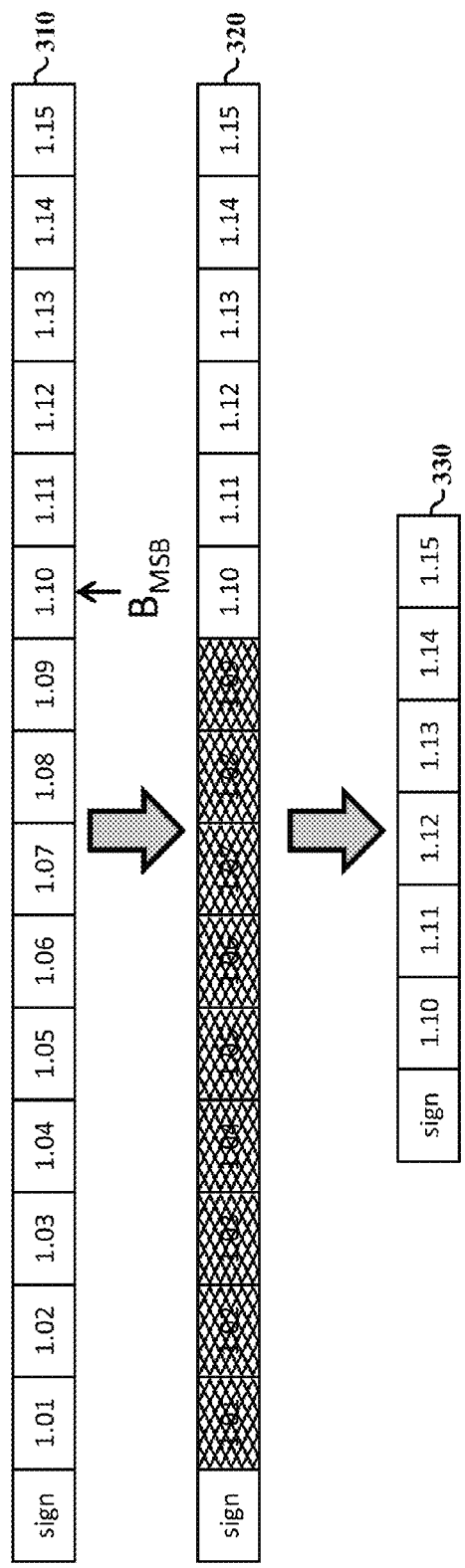
FIG. 3 shows a data access and compression operation, in accordance with one or more embodiments.

FIG. 2 depicts architecture of a radar apparatus 200, in accordance with another example embodiment. The radar apparatus 200 includes an analog-to-digital converter (ADC) 210, which converts received analog radar signals into digital form and passes the digitized received signals to a digital front-end (e.g., for sample rate conversion and synchronization) (DFE) 212. A direct memory access controller 214 stores the output of the DFE 212 in level-one (L1) memory 220. A digital signal processor (DSP) 230 carries out a Fast Fourier transform (FFT) operation on data in L1 memory 220. A read-write direct memory access (DMA) controller 222 reads and writes data from L1 memory 220, provides data to SPI 223, and transfers data output from the FFT operation to compression buffer 224.

Compression/decompression block 240 compresses the data from the FFT operation, by removing bits therefrom, encoding tree 242 encodes the compressed data, and block 244 transposes elements of the compressed data for storage at level 2 (L2) memory 246. This transposing ensures samples of a column of a matrix will not be stored at consecutive memory addresses and are therefore read from memory with a single value per access.

In various embodiments, the radar apparatus 200 is implemented to carry out two different modes. In the first mode (mode 1), a data compression approach is established. In a second mode (mode 2), measurement data is processed using data compression configured in mode 1, with memory read and memory write operations according to a memory address map. In mode 1, a number of bits used to represent the digital values of FFT output samples is determined. A table is built in which the number of bits is stored in each FFT output sample index, and the FFT operation is executed over a set of consecutive samples originating from the same signal (e.g., FMCW chirp). To determine the number of bits $N_{test}$, FMCW chirps are transmitted, or the first $N_{test}$ chirps of a radar measurement cycle are used. The compression can be reconfigured for every radar measurement cycle. During setup, the same system configuration that will be used in the subsequent measurement operation can be applied.

In some embodiments, the setup for the compression is calculated as follows. For each FFT output index $N_{test}$ samples are available. The mean of the absolute value and the standard deviation of the absolute value are determined using equations (6) and (7).

$$\mu(n) = \frac{1}{N_{test}} \sum_{m=0}^{N_{test}-1} |X(n,m)| \quad (6)$$

where $|X(n,m)|$ refers to the absolute value of sample n of test chirp m. In addition the standard deviation of the absolute value is determined according to equation (7).

$$\sigma(n) = \sqrt{\frac{1}{N_{test}} \sum_{m=0}^{N_{test}-1} |X(n,m) - \mu(n)|^2} \quad (7)$$

The number of bits B(n) for index n can now be calculated as in equation (8):

$$B_{MSB}(n) = \left\lceil \log 2\left(\frac{\mu(n) + \alpha\sigma(n)}{2^{Nbits-1}}\right) \right\rceil + 1 + \Delta B(n) \quad (8)$$

where Nbits is the number of bits before compression and a is chosen to fulfill a SNR criterium. The number of bits after compression is increased to account for the increase in dynamic range due to the second FFT. The increase is $$\Delta B(n) = \left\lceil \frac{\log 10(N_{chirp})}{6.02} \right\rceil, \quad (9)$$

where ⌈y⌉ indicates rounding y to the nearest integer in the direction of positive infinity. The outcome of mode 1 is a list $B_{table}=[B_{MSB}(0), B_{MSB}(1), \ldots B_{MSB}(N_{FFT}-1)]$.

In mode 2, measurement data is processed. An FFT operation is performed over a set of consecutive samples originating from the same received signal (e.g., FMCW chirp), and maps signals originating from the reflecting objects in the field of view of the radar to distance. To perform the FFT operation, signals received are converted to digital values by the ADC 210 and transferred to the L1 memory 220. The DSP 230 reads these values and performs computation steps, after which the transformed data resides in the L1 memory 220.

The data is then compressed, with the read/write direct memory access (DMA) controller 222 transferring the FFT output samples to the compression buffer 224. For each FFT sample index n, the corresponding number of bits B(n) are selected and the remaining bits of the current sample are discarded. This may, for example, be carried out in a manner consistent with that shown in 3, beginning with bits at 310, selecting bits for removal as shown at 320, with the resulting data shown at 330. This operation is performed for all samples of the FFT output.

Elements of a corresponding matrix of the data are transposed, consistent with the above, so that samples of a column of a matrix will not be stored at consecutive memory addresses and are read from the memory with a single value per access. By transposing the matrix, the samples for the $2^{nd}$ FFT will be stored at consecutive memory addresses allowing the memory to be read with a vector of values per memory access.

In some implementations, the transposing operation is executed by swapping stored data values at addresses (row, column) (m,n) and (n,m). However, in case of compressed data the number of bits required to store the digital value at address (m,n) can be different from the number of bits used to represent the data at address (n,m). Therefore elements can be shifted to make room. Compressed values of each FFT output are written to a specific memory address, with the address for sample (n,m), (the $n^{th}$ sample of the $m^{th}$ chirp) being written at an offset of a base address, as consistent with equation (10).

$$A(n,m)=A_n+mB(n) \quad (10)$$

The base address $A_n$ can be calculated based upon the previous base address, consistent with equation (11)

$$A_n=A_{n-1}+N_{chirp}B(n) \quad (11)$$

The address $A_0$ is the absolute starting address.

Figure 4:
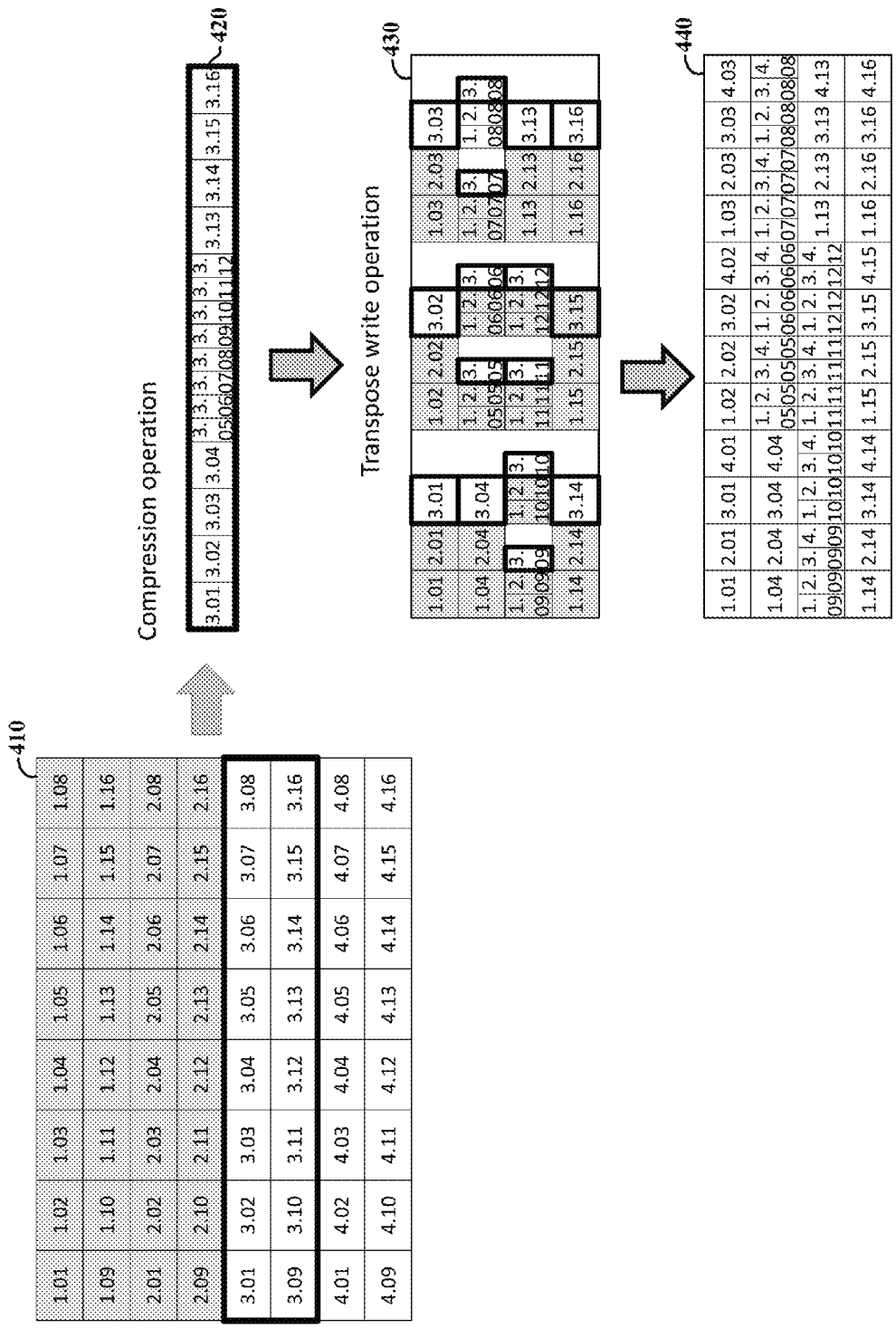
FIG. 4 shows a compression and memory write operation, in accordance with one or more embodiments.

FIG. 4 shows a compression and memory write operation for data 410, in accordance with one or more embodiments, where (by way of example) $N_{FFT}=16$ and $N_{chirp}$ is 4. Chirp 1 and 2 have been compressed and written to memory. The FFT output corresponding to chirp 3 is compressed using $B_{table}$ and written to memory addresses A (n,m). Compression by way of example is shown at 420, with a transposition at 430 and resulting matrix at 440. In this figure the number of bits per sample is indicated by the width of the box that represents the sample. The process is continued until all chirps have been processed.

After all FFTs have been calculated, compressed and stored to memory, a second round of FFTs is started, of size $N_{chirp}$. A consecutive section of the memory is accessed, with the start address of the memory section being given by a base address. The end of the section is given by the base address increased by $N_{chirp}$ B (n) and the base address for the next FFT is given by $N_{chirp}$B (n)+1. After the section of memory has been transferred to the compression block, a decompression operation is performed. In the data decompression step, zeros are appended to the packed value. The number of zeros is equal to Nbits–B (n). The decompressed data is transferred to the local DSP memory (L1 memory 220) where FFT and windowing operations are performed.

After completion of these operations the data is transferred back for compression by the write/read DMA 222. For all of the $n^{th}$ FFT sample indices, the corresponding number of bits B(n) are selected and the remaining bits of the current sample are discarded. This operation is performed for all samples of the FFT output. After the data has been compressed it is written back to the memory. The addresses are the same as the read addresses, with the respective steps continuing until the all samples have been processed.

Figure 5:
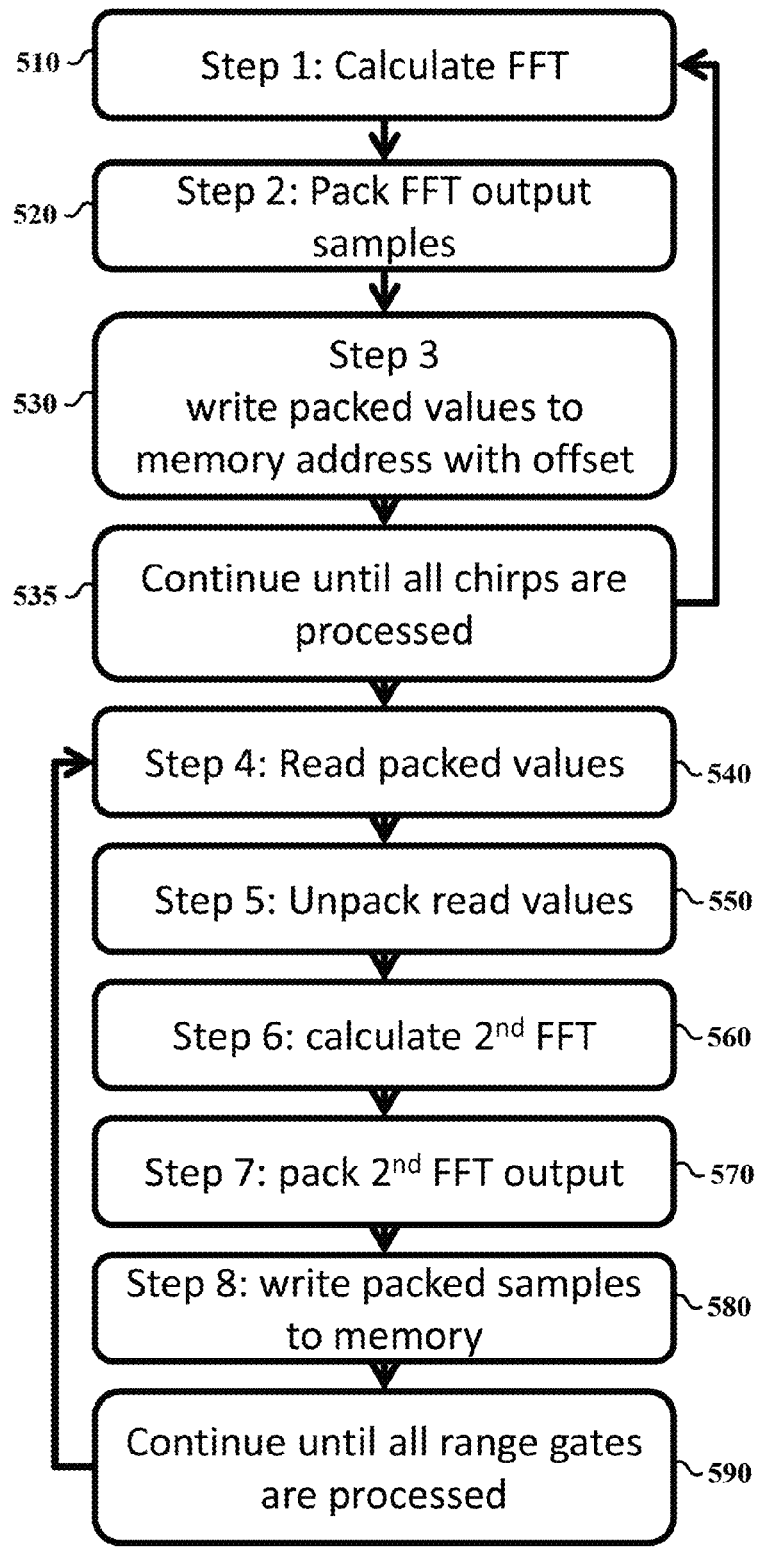
FIG. 5 shows a method for processing radar data, in accordance with one or more embodiments.
Figure 6:
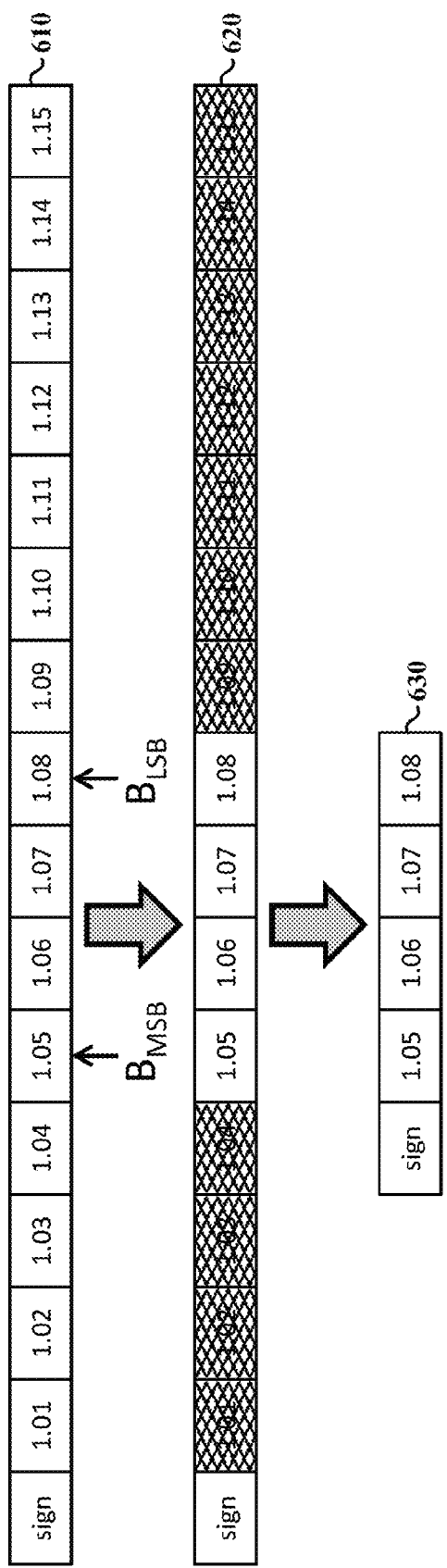
FIG. 6 shows a compression operation as may be carried out in accordance with one or more embodiments.

FIG. 5 shows one such implementation, with respective steps as discussed above being carried out as shown for mode 2, in accordance with one or more embodiments. At 510, a FFT is calculated, the FFT output samples are packed at 520, the packed values are written to memory with an offset at 530, and the process continues until all chirps are processed as represented at 535. Packed values are read at 540, the read values are unpacked at 550, and a second FFT is carried out on the unpacked values at 560. The second FFT output is packed at 570, the packed samples are written to memory at 580, and the process continues as shown at 590 until all range gates are processed.

In some implementations, the smallest absolute value that is representable is determined by the number of bits before the initial compression as shown in equation (8). In cases of a high noise level, data may be further compressed by increasing the quantization step size. In this case, equation (8) is used to determine the most significant to be kept. However to determine the least significant bit, equation (12) is used as follows, $$B_{LSB}(n) = \left\lceil \log 2\left(\frac{\beta \sigma(n)}{2^{Nbits-1}}\right) \right\rceil \quad (12)$$

in which β is chosen to fulfill a required SNR criterion. For example β=1 corresponds to a decrease of SNR with 3 dB.

6 depicts such a compression operation, in accordance with one or more embodiments. Data 610 is compressed as shown with regard to most significant bits (MSB) and least significant bits (LSB), removing bits as represented at 620 to arrive at data 630.

One or more embodiments described herein, such as those described in connection with the figures above, may be applied to a variety of radar-type applications. Some embodiments are directed to automotive radar systems in which a radar signal is modulated according to a specific waveform principle and transmitted at a predetermined carrier frequency. The signal is reflected off of objects back to the automobile, where the signals are received and down-converted to baseband signals by an analog receiver, then digitally processed. In these processing steps, one or more of the distance to an object, the relative radial velocity (the velocity at which the object is approaching the car), and the angle between the object and the car are calculated.

Certain such automotive radar systems, as may be implemented with various embodiments, include a transmitter, a receiver and a control/processing section, in an IC. The transmitter includes a high-frequency chirp generator that produces a FMCW at a frequency which may be, for instance, 24 GHz. The chirp signal is supplied to a phase locked loop (PLL) and the frequency is tripled in a frequency tripler and the signal is amplified by a power amplifier and transmitted by an aerial or antenna as a radar signal. In the presence of a reflective object, a reflected radar signal is received at the receiver via one or more aerials or antennas. The received signal is indicative of a distance to an object, the relative radial velocity and the angle between the object and the vehicle. Each received signal is amplified and down-converted by being mixed with a copy of the output of the frequency tripler (e.g., to provide an indication of signal delay, which is indicative of the distance that the signal traverses and thus the distance between the transmitter and the reflective object). Each down-converted signal is filtered, digitized (e.g., via an analog-to-digital converter (ADC)), and provided to a digital signal processor. A clock generator provides a clock function, a timing reference device provides appropriate timing signals, and a microprocessor compresses the digitized signals as discussed herein. The compressed output may be communicated with other electronics within the automobile, such as over a controller area network (CAN) bus. In some implementations, the IC is a single IC, with memory limited by way of the compression and related reduction in amount of data that is stored for providing radar-based signals.

In some FMCW embodiments as above, a sine wave with a linearly increasing or decreasing frequency is transmitted. In the down conversion operation the transmitted signal is mixed with the time delayed transmitted signal. If the relative velocity between the radar system and the reflecting object is zero, the time delayed signal is an attenuated and phase rotated version of the transmitted signal. The result of the down conversions operation is a sine wave oscillating at the beat frequency. The frequency depends on the distance to the reflecting object D the different between the start and the stop frequency of the ramp Δf and the duration of the ramp $T_{chirp}$:

$$f_{beat} = \frac{\Delta f}{T chirp} \frac{2D}{c_0}, \quad (1)$$

where $c_0$ is equal to the speed of light. If the relative velocity is non-zero, the corresponding Doppler frequency is added to the beat frequency. If the duration of the chirp is very short, such as shorter than 100 μs, and the frequency deviation is at least several tens of MHz, the Doppler frequency is very small compared to the beat frequency and can be ignored in the calculation of the distance (the Doppler component will, however, change the phase of the received frequency ramp). A 2D FFT is used to calculate the relative radial velocity, in which each received chirp is converted to the frequency domain by means of an FFT operation and stored in a row by row fashion, and an FFT operation is performed over all the samples in a single column, for each column. The relation between the distance and the beat frequency is linear, with the beat frequency increasing with increasing distance to the reflecting object. Multiple reflections (from different objects) may be present in the field of view of the radar system, in which case the output of the down conversion operation is a summation of sine waves oscillating at the beat frequencies corresponding to the distances to reflecting objects.

The dynamic range of the signal is the difference between the largest and smallest observable signal, and depends on the distance to an object and on the radar cross-section of the object. The smallest observable signal is the system noise. The largest observable signal is a reflecting object at a short distance of the radar. Different sources of noise may exist, such as additive thermal noise, phase noise and clutter, in view of which noise may not be spectrally flat.

As the transmitted signal propagates towards the reflecting objects its signal strength decreases, which relates to path loss. For regions close a transmitter, little to no path loss exists such that the antenna efficiency, feed line losses and reflection losses generally contribute to losses. Such close-region path loss can be described as in equation (2):

$$\frac{P_r}{P_t} = \alpha \tag{2}$$

where $P_r$ and $P_t$ represent the transmitted and received signal power respectfully. When a reflective object is at a greater distance from the transmitter/receiver, it will reach a point at which an illuminated area of the reflected signal projected at the receive antenna exceeds the dimension of the receive antenna. From this distance onwards exemplary path loss is given by equation (3):

$$\frac{P_r}{P_t} = \frac{G_r G_t \lambda^2}{4(4\pi)^2 D^2}, \tag{3}$$

where $G_r$, $G_t$ and $\lambda$ represent the receive antenna gain, transmit antenna gain and wavelength respectfully. This equation is applicable to a point at which the dimensions of the area illuminated by transmitted radiation pattern exceed the dimensions of the reflecting object. Distances above this distance may be represented via the following equation for the path loss given by equation (4):

$$\frac{P_r}{P_t} = \frac{G_t G_r \lambda^2 \sigma}{(4\pi)^3 D^4} \tag{4}$$

in which $\sigma$ represents the radar cross section.

Generally, objects located close to the transmitter and receiver (or transceiver) have a low beat frequency and large received power, whereas objects far away have a high beat frequency and small received power. Where multiple objects at various distances are present in the field of view of a radar system, the difference in received power between objects close by and objects at the end of the measurement range can be very large. In many cases however, signals from reflecting objects far away are smaller than the noise injected by the receiver front-end. Therefore the dynamic range may be referred to as the difference between the power at the output of the transmitter, reduced by loss in a region corresponding to nearby objects and the power level of the thermal noise.

The dynamic range may be reduced by attenuating lower frequencies of received radar signals, such as by using an analog filter with a high-pass (HPF) characteristic to attenuate the lower frequencies. The equalization of the dynamic range may, however, be limited as the noise introduced by the HPF increases with increasing cut-off frequency, as may be addressed in connection with one or more embodiments herein.

One or more embodiments as described herein involve the compression of data based upon distance characteristics of a channel involving a Doppler effect and/or a multiple-antenna spectrum. For instance, data can be compressed based upon predictability in the Doppler or multiple-antenna spectrum as follows. A radar signal is extracted and converted to a representation in which an object is separated in distance, and a predictive model is used to predict further measurements. This model may, for example, be learned from the object at hand, or using another object with relevant data stored for later access. The differences between the predictor and new measurements are encoded, facilitating desirable compression ratios. These approaches can be used to facilitate compression of radar/sonar type data, and can address issues relating to storing data including information characterizing both distance and speed and, in some instances, characterizing angle. In this context, storing such data for processing and object detection which otherwise requires large memory can be carried out with smaller memory. Accordingly, both Doppler speed and multiple-antenna angle measurement may be implemented by repeating a similar type of measurements, with high predictability between the approaches.

Figure 7:
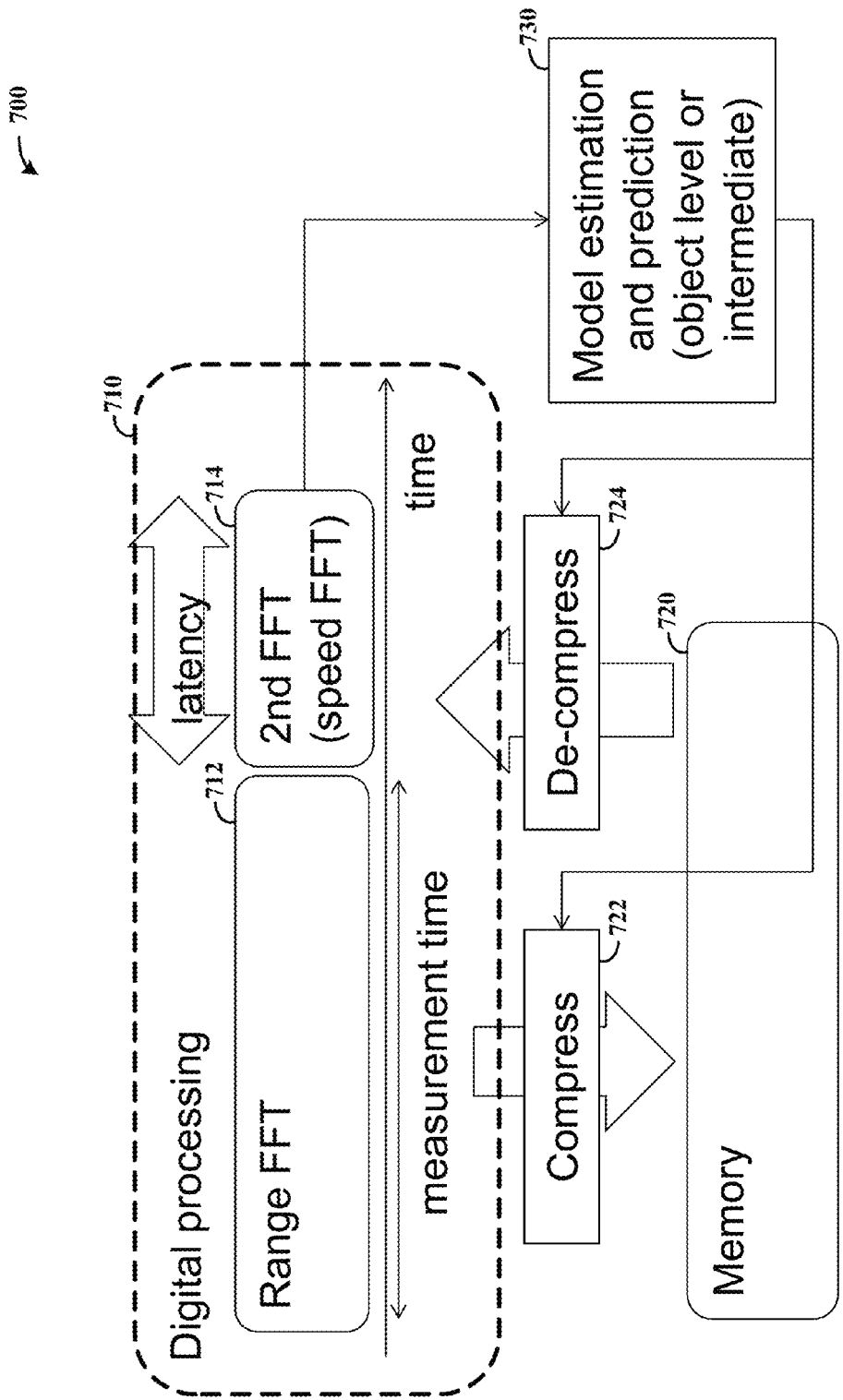
FIG. 7 shows a system and approach for Doppler-based compression, in accordance with another example embodiment.

FIG. 7 shows one such system 700 and approach for Doppler-based compression, in accordance with another example embodiment. A digital processing block 710 includes a first (range) FFT block 712 and a second (speed) FFT block 714. A memory 720 stores data compressed at compression block 722, and provides access to the stored data via decompression at decompression block 724. A model estimation and prediction block 730 operates upon an output of the second FFT block 714 to generate modeling characteristics, and provides the generated characteristics to the compression block 722 and decompression block 724.

The system 700 can be implemented in a variety of manners, to suit various needs. In some embodiments, radar/sonar data measurements are transformed by a distance-dependent transformation with first and second FFT blocks 712 and 714 (e.g., as used in Frequency Modulated Continuous Wave (FMCW) systems). A number of such measurements are collected one after each other and object movement is detected as small differences between the measurements, based on the Doppler effect, to obtain speed-based information. In some implementations, information characterizing an angle at which the object or objects lie is obtained using multiple sensors in parallel and again the angle information is expected to be captured by small differences in the multiple measurements. The measurements are used to generate a model at block 730, which can be continuously updated as new data is obtained. In some embodiments, multiple distance measurements can be combined to extract velocity information, and in certain embodiments measurements from multiple antennas are combined to extract angular information. Differences between the model predictions and new data can be encoded before saving to memory. For complex numbered spectrum signals, the model may be built based upon angle and phase complex number representation, to facilitate a high compression ratio.

Various compression schemes may be implemented with blocks 722 and 724. For instance, lossless or lossy compression schemes (e.g., as described herein) can be implemented to suit particular applications. For a lossy scheme, some information is lost/discarded in an effort to efficiently use memory. For instance, system performance can be degraded such that the loss of information due to compression is gradually altered (increased). In another approach, data loss is tailored to meet application requirements, such as to minimize or reduce chances of losing certain information deemed important.

Figure 8:
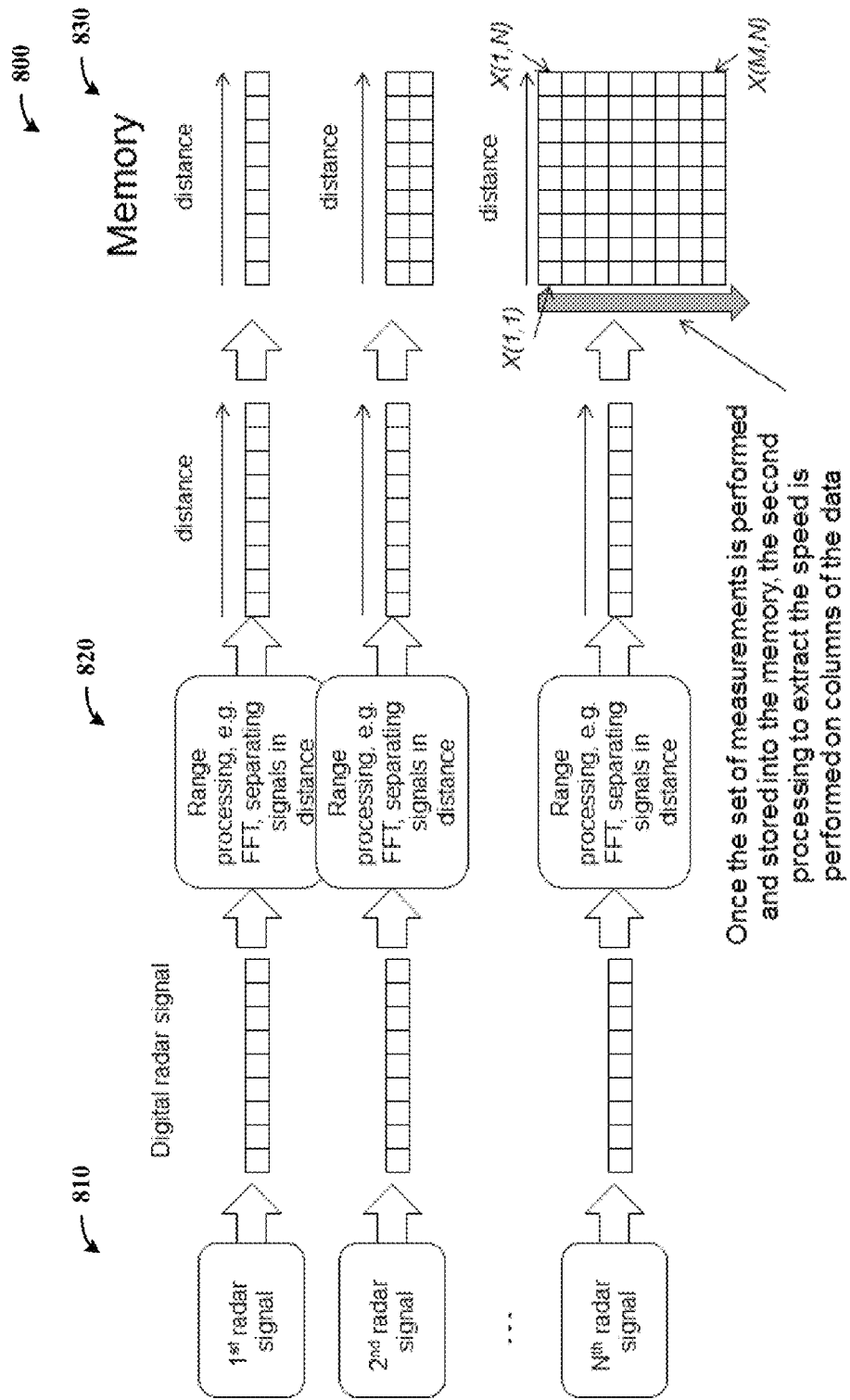
FIG. 8 shows a data flow diagram for a Doppler/range radar/sonar system approach involving the measurement of object distance and velocity, in accordance with another example embodiment.

FIG. 8 shows a data flow diagram 800 for a Doppler/range radar/sonar system approach involving the measurement of object distance and velocity, in accordance with another example embodiment. Incoming radar signals 1–N are received at 810, represented digitally and processed via a FFT for determining range (e.g., separating signals in distance) at 820. Distance-based data for the respective signals is stored to memory at 830, in sequential manner. Once enough measurements are gathered, a second processing function is carried out to extract speed on the stored data corresponding to the Doppler Effect and object velocity. Memory elements are complex numbers denoted by X(m,n) where m and n is the position (the $n^{th}$ sample of the $m^{th}$ chirp as before). Accordingly, each distance measurement may be characterized as having N elements, with M measurements performed for the speed detection.

Each complex number X(m,n) consists of real part real (X(m,n)) and imaginary part imag(X(m,n)), and is processed accordingly. The complex numbers can be also represented in polar coordinates where the amplitude is equal to:

$$a(m,n)=\sqrt{\mathrm{real}(X(m,n))^2+\mathrm{imag}(X(m,n))^2}$$

And phase:

$$\theta(m,n)=\mathrm{atan}(\mathrm{imag}(X(m,n)),\mathrm{real}(X(m,n)))$$

After distance processing, the signals separate in distance and appear grouped, at which time objects that are nearer to a transmitter/receiver provide a stronger signal than objects that are far away due to channel characteristics. The objects at different distances or/and with different speeds can be seen as peaks in the signal.

Figure 9:
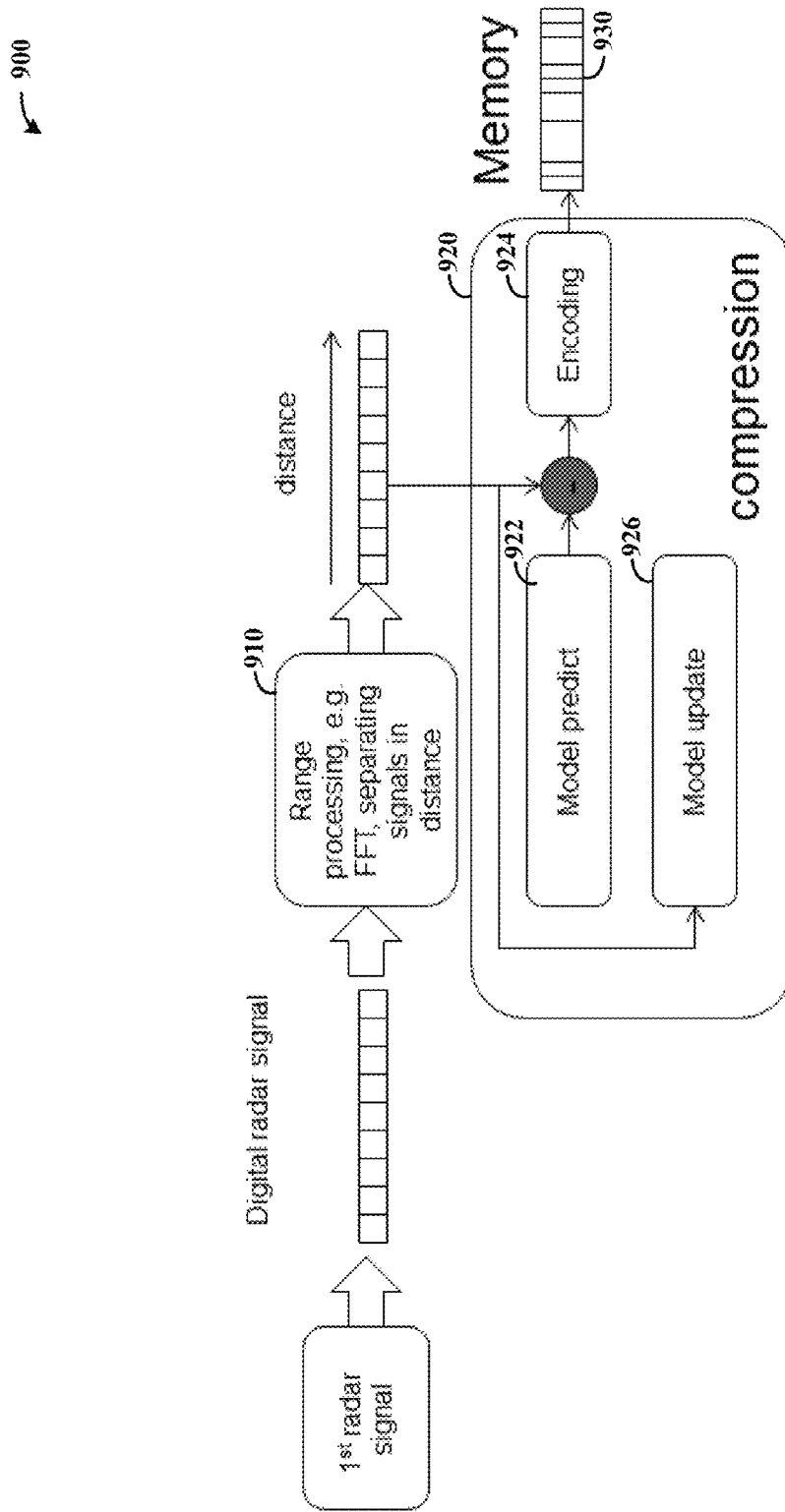
FIG. 9 shows a compression approach, as may be implemented in connection with one or more embodiments as described herein.

FIG. 9 shows a compression approach 900, as may be implemented in connection with one or more embodiments as described herein, such as with FIG. 7 and/or FIG. 8 above. For a signal measurement m that includes N complex numbers X(m,1), ... , X(m,N), the measurement may represent a row of the matrix shown in FIG. 8, where each column n corresponds to a certain distance. Range processing (e.g., FFT) is carried out at range block 910, with the output being distance-related data that is used at a compression block 920 at which a model is predicted at block 922 and used to predict new measurements that are encoded at block 924 and stored in memory 930. Update block 926 updates the generated models based upon additional distance data received from the range block 910, which can be used to continually improve the model.

In some implementations, a separate model is built for each column n in a matrix such as that shown in FIG. 8. In other implementations, multiple columns are processed. As signals often change rapidly in amplitude for each column, amplitude and phase representation can be used as discussed above. Referring to the model as $a_{model}$, using a phase derivative to represent the phase as it changes, the previous value of the model is set at amplitude $a_{model}$ (m−1, n) phase θ (m−1, n), phase derivative $\dot{\theta}$ (m−1, n), with t being the time between two measurements. The prediction for the new data can be thus calculated by:

$$X(m,n)_{prediction}=a_{model}(m-1,n)e^{i(\theta(m-1,n)_{model}+\dot{\theta}(m-1,n)_{model}t)}$$

The difference between the measured data and the model X(m,n)−X(m,n)$_{prediction}$ is encoded at block 924 and saved to memory 930. Various methods for encoding can be used to suit particular embodiments, such as Huffman coding or Arithmetic coding. A variable number of bits are used for differences, to present data with fewer bits for certain applications, using less memory.

Model updating is carried out at update block 926 in one or more of a variety of manners. In some implementations, the model is updated in attempt to improve the prediction for the next measurement. The update can be performed for example by:

$$a_{model}(m,n)=\alpha a_{model}(m-1,n)+(1-\alpha)a(m,n)$$

in which α is a factor taking values from 0 to 1 used to control how fast the model is influenced by the new measurements. The phase and phase change are represented as:

$$\theta_{model}(m,n)=\theta(m,n)$$

$$\dot{\theta}_{model}(m,n)=\beta\dot{\theta}_{model}(m-1,n)+(1-\beta)(\theta(m,n)-\theta_{model}(m-1,n))/t$$

where β is a factor taking values from 0 to 1 and is used to control how fast the model is influenced by new measurements. In certain embodiments, the phase measurements are handled by unwrapping the phase. Accordingly, the model follows the amplitude and phase of the signal being processed. In some implementations, a Kalman filter is used with a similar approach in which the presented equations are a simplified Kalman filter version, and in other implementations a lossy approach is used.

Figure 10:
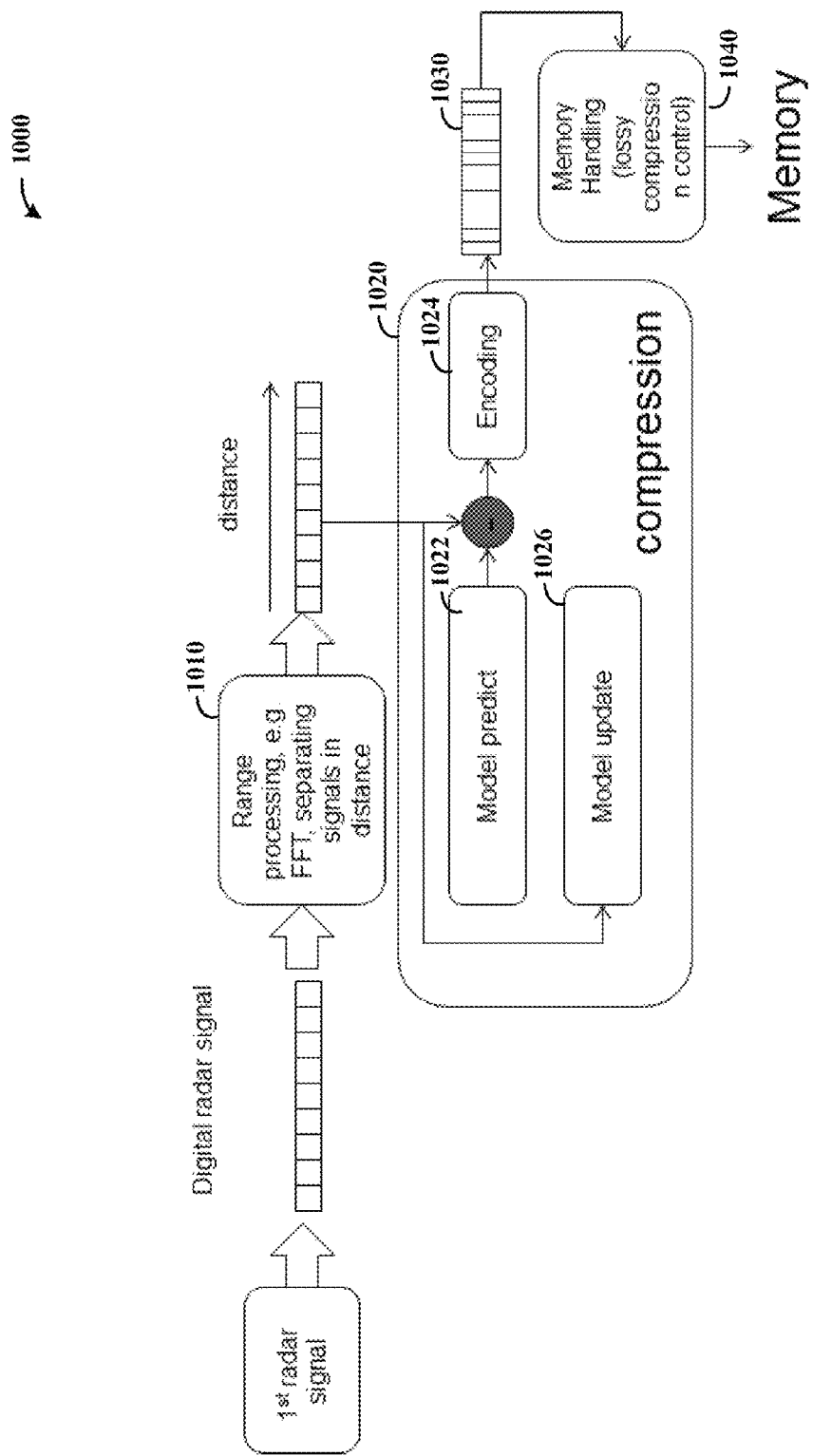
FIG. 10 shows another compression approach with memory and lossy compression control, in accordance with another example embodiment.

FIG. 10 shows another compression approach 1000 with memory and lossy compression control, in accordance with another example embodiment. The approach shown in FIG. 10 may be implemented in a manner similarly to that shown in FIG. 9, involving a range block 1010, compression block 1020 (model prediction block 1022, encoding block 1024, update block 1026), and memory 1030. A memory handling block 1040 is further implemented to handle lossy compression. For instance, a limit on memory usage may be used to control/determine aspects of lossy compression, such as by setting a maximum number of bits per column (e.g., by setting certain limit such as 0.01% on the probability that information will be lost due to lack of memory space). In various implementations, variable bit-length radar data is processed in this regard by storing bits in each column next to one another, facilitating reading of the data in a transposed manner for an ensuing FFT for extracting object speed.

Figure 11:
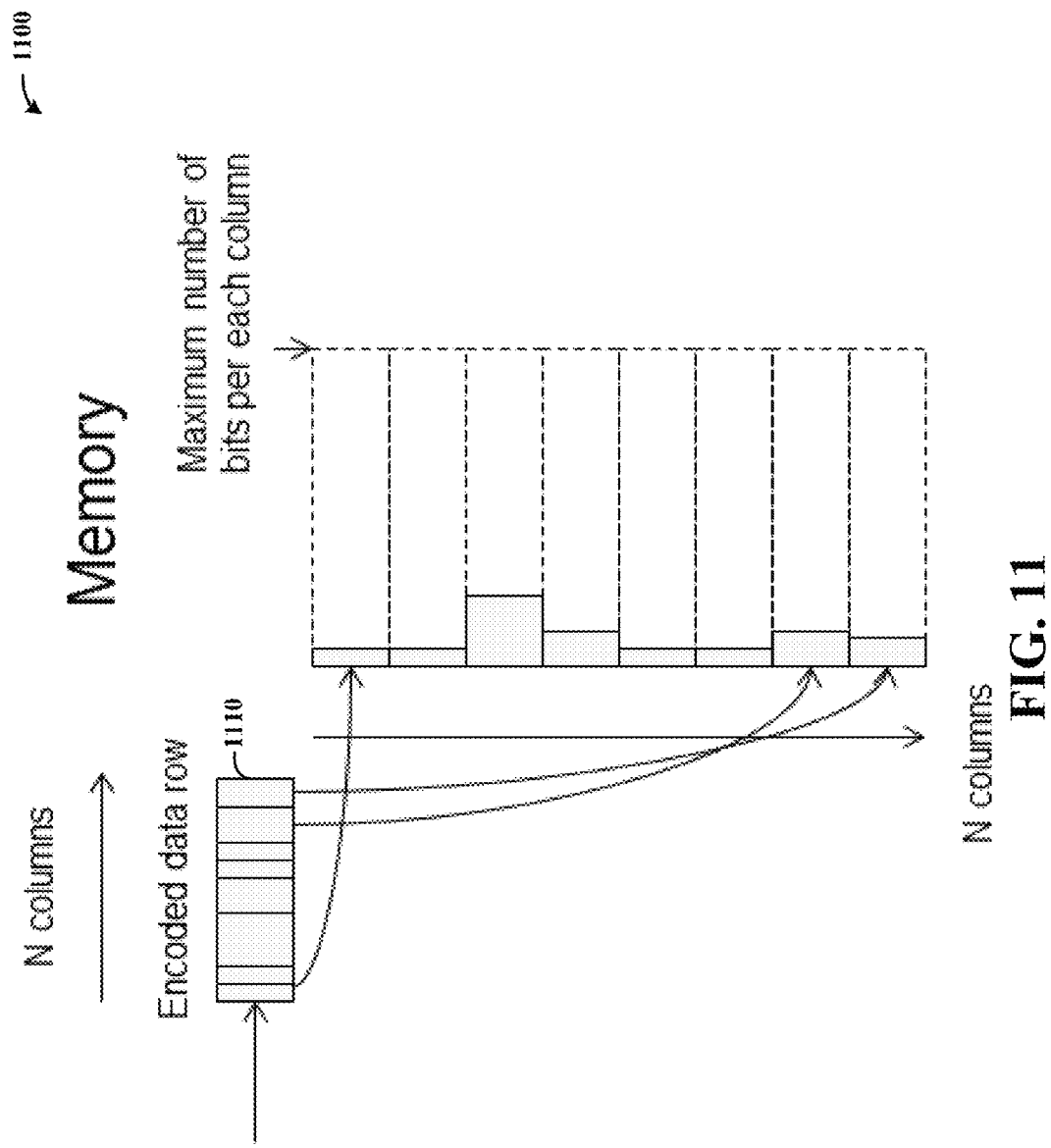
FIG. 11 shows a lossy compression memory organization approach for transposed writing, in accordance with another embodiment.

FIG. 11 shows a lossy compression memory organization approach 1100 for transposed writing, in accordance with another embodiment. An encoded data row 1110 is stored in memory as shown over N columns, in a transposed manner in which columns become rows and with each column having a maximum number of bits as shown via dashed lines. Each element of each new measurement data row is split after encoding, and the bits are added to corresponding memory space reserved for its column. After all (e.g., M) measurements are performed some of the rows (corresponding to columns in the original representation) might have some empty space where data is compressed more than expected, whereas some rows might not have enough space to accommodate all M samples. In such cases, once the row is filled the new data for that row (column in the original representation) is discarded. In some implementations in which a row is filled, the new data that does not fit is saved into another part of the memory.

Figure 12:
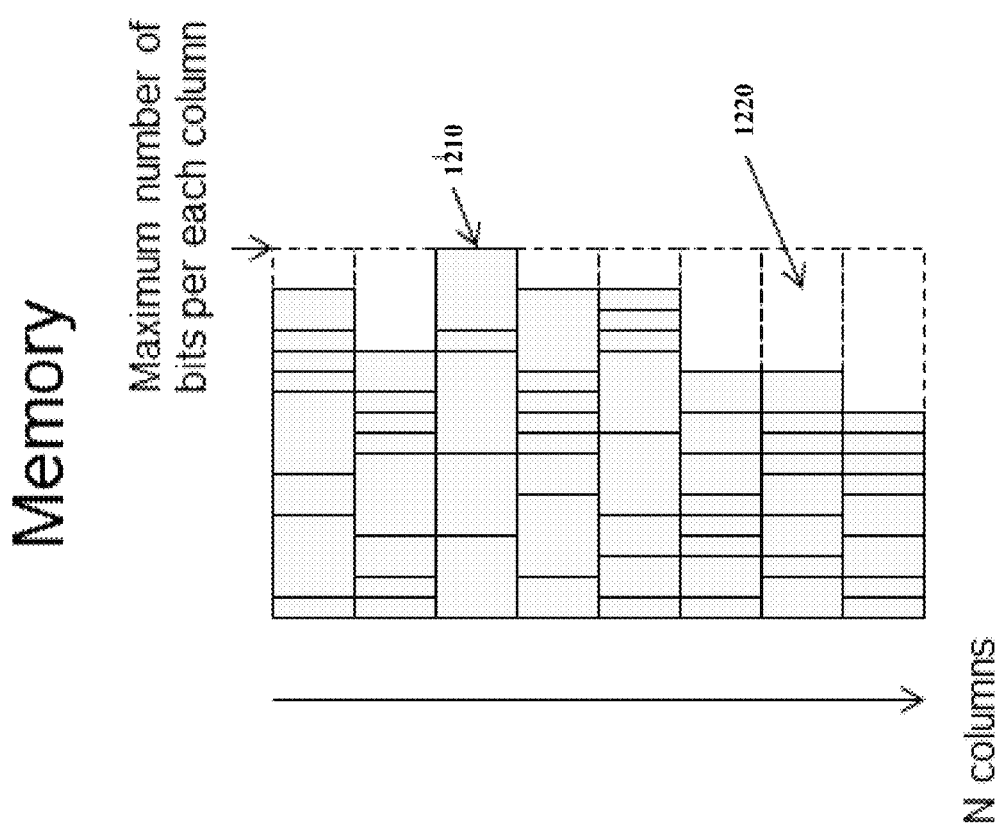
FIG. 12 shows a lossy compression memory organization approach, as may be implemented with another embodiment.

FIG. 12 shows a lossy compression memory organization approach 1200, as may be implemented with another example embodiment. By way of example, row 1210 is shown as being completely filled, whereas row 1220 has space. In some instances, the chance that data is lost is held to be very small, or otherwise limited to low influence upon resulting calculations (e.g., in some implementations, 10% of the data is lost with little change in the data appearance). In some instances, empty rows such as row 1220 are accommodated by dynamically adjusting where each row starts and ends, based on current data and a prediction of how many bits are needed for each row. For example if after at 50% of M measurements, some rows are more than 50% full, these rows are extended. A similar check can be performed as more data is received, with rows extended accordingly based upon a predicted row length needed.

Row length is managed as follows, in accordance with a particular embodiment. With K being a number between 0 and 1 describing which part of the data is received, N(n) being a current expected length in bits for row n (column from the original representation), and B(n) being a current number of bits used for this row, an algorithm as follows may be implemented in which the following steps are carried out after 50% of M measurements have been made, thereafter at 5% data measurement increments:

1. Predict, for each row, the final size of the row as N(n)=(B(n)/K)+N_bits_margin; and
2. Based on the predictions, adjust the starting points and lengths of the rows such that the memory is efficiently used.

For example, if B(n)=100 bits are already used for the first 50% of data, the prediction is that it will take 200 bits for the whole row. Some margin number of bits N_bits_margin (e.g., 5%) can be added to ensure that less bits are reserved than needed at the end.

Figure 13:
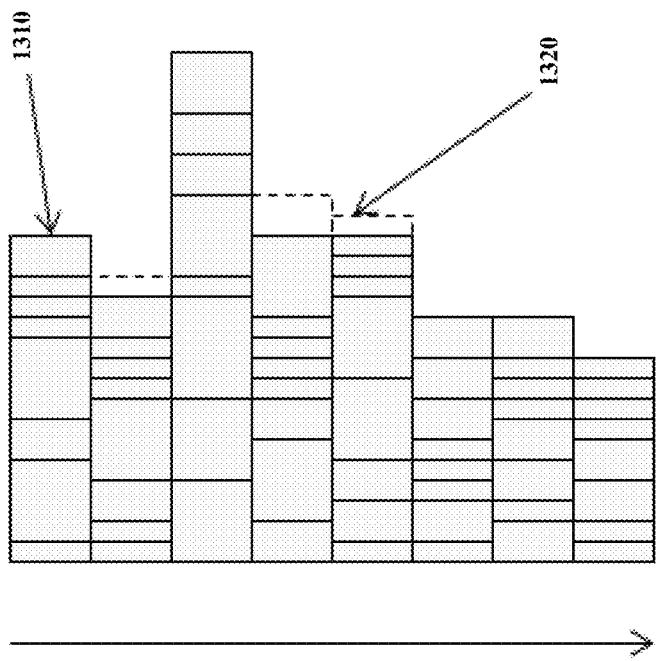
FIG. 13 shows a lossy compression approach with adaptive memory organization, in accordance with another embodiment.

FIG. 13 shows a lossy compression approach 1300 with adaptive memory organization, in accordance with another embodiment. As shown at 1310, a maximum number of bits per column may be adjusted as data is received, with memory blocks moved to minimize a number of spaces. As shown at 1320, when a last M-th measurement (of M measurements) is performed, empty spaces may remain and can be removed. In some instances, latency is reduced by skipping memory reorganization for empty spaces.

As may be implemented in connection with one or more of the above approaches, lossy compression is tailored based upon characteristics of objects from which radar data is received. For instance, objects that are further away may be deemed to be less important with respect to proper detection thereof, relative to nearby objects. As such, a lossy compression scheme is implemented in which memory is reserved for objects that are further away with a lower priority relative to memory reserved for nearby objects. For example in automobile radar scenarios, a maximum speed "v" and distance "d" may be used to calculate a time to collision $t_{colision}$=d/v. For the data parts where the expected time to collision is more than 1 s, 20% less than maximum memory may be reserved, whereas data parts having an expected time to collision that is more than 2 s, 40% less than maximum memory might be reserved.

Figure 14:
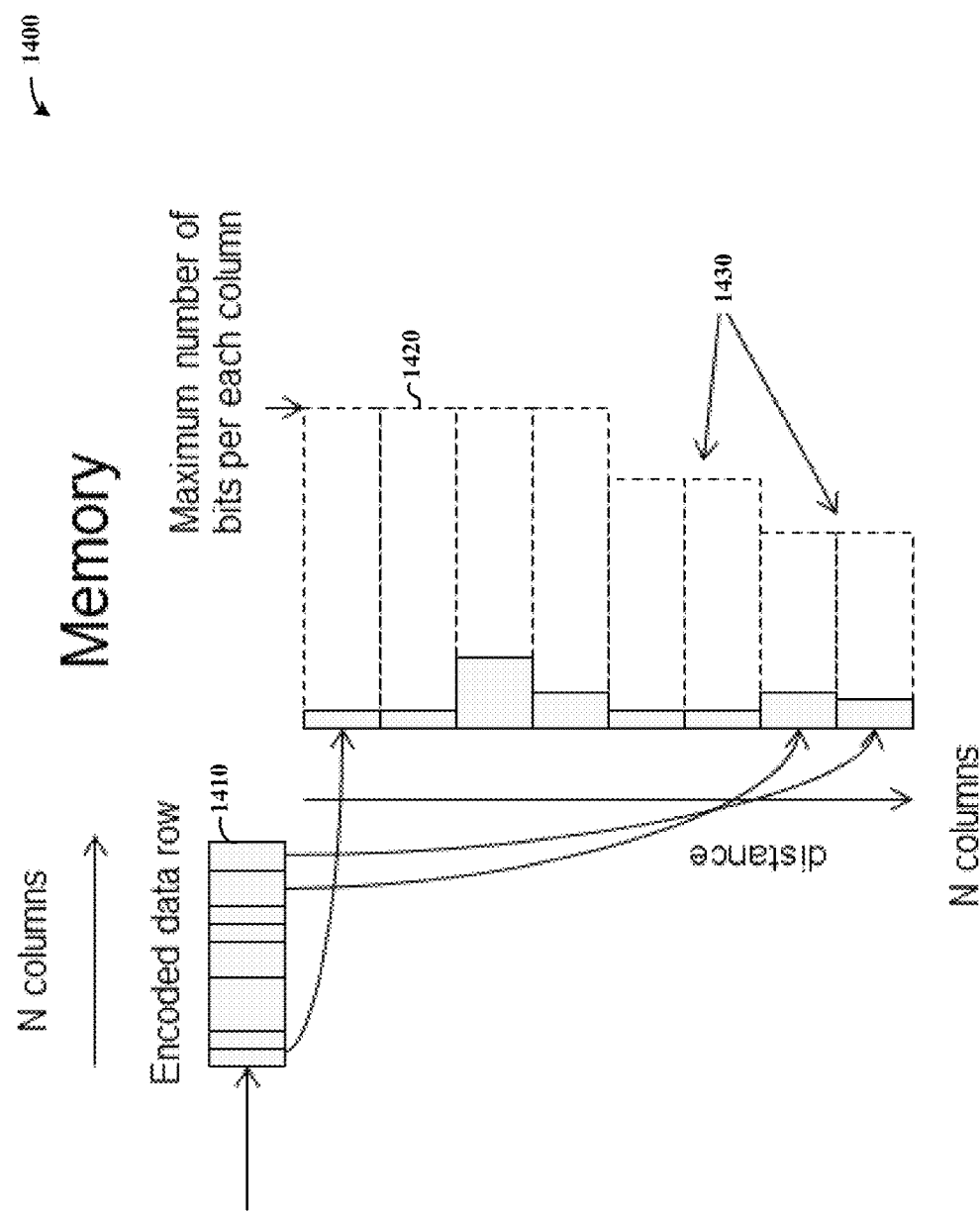
FIG. 14 shows a lossy compression approach with memory organization adapted to application requirements, in accordance with another example embodiment.

FIG. 14 shows a lossy compression approach 1400 with memory organization adapted to application requirements, in accordance with another example embodiment. An encoded data row 1410 is stored as shown, with respective columns being reserved with different maximum numbers of bits corresponding to different application requirements. For instance, data stored in column 1420 may be deemed more important than data stored in columns at 1430, with the latter having less bits reserved (e.g., respectively for far/nearby objects as described above). In some implementations, a decision or adjustment of column length is made after a second processing step as discussed above, in which speed is extracted from object data and provides relatively more information regarding object movements. Such an approach can be used to provide a better selection of data that is more important than other data.

Figure 15:
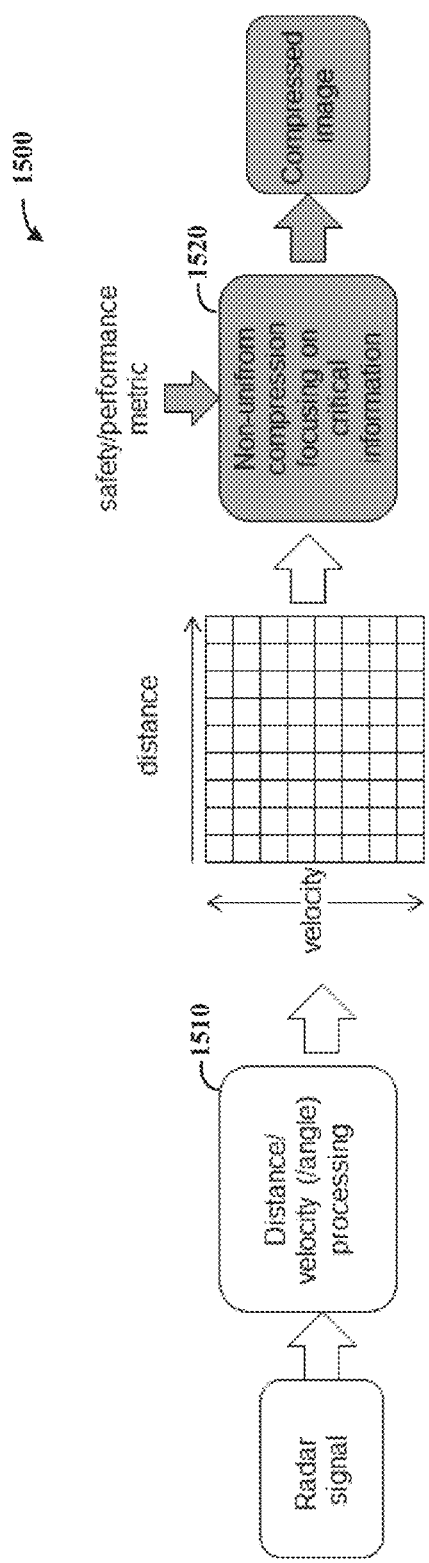
FIG. 15 shows a system and approach in which time to collision is used as a criterion for controlling memory use, in accordance with another example embodiment.
Figure 15:
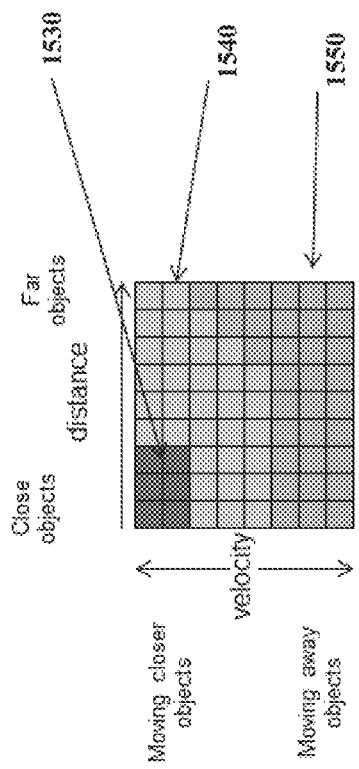

FIG. 15 shows a system 1500 and approach in which time to collision is used as a criterion for controlling memory use, in accordance with another example embodiment. Distance and velocity processing is carried out at block 1510, to determine object distance from a transmitter/receiver. Velocity may, for instance, be determined using a Doppler Effect as discussed herein. In the matrix as shown, region 1530 pertains to more important data as may relate to objects that are closer and higher velocities. Region 1540 pertains to less important data, such as data with a time to collision that is less than 2 seconds but more than 1 second. Region 1550 pertains to least important data, such as that pertaining to object more than 2 seconds away, low relative velocity or not on a collision course. For detecting objects on a collision course, angular data may be extracted, such as in radar/sonar systems using multiple antennas/sensors. Accordingly, compression at block 1520 is carried out in a non-uniform manner, taking these characteristics into account.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., data compression, distance estimation, channel loss estimation, or data storage). For example, application specific hardware processing blocks may be used, such as with arithmetic and Huffman encoding blocks that use additional memory for probability tables used for encoding (e.g., with fixed tables applied in same cases). Tables that are updated might be shared by a number or all rows. As another example, in certain of the above-discussed embodiments, one or more modules are discrete logic circuits or programmable logic circuits configured and arranged for implementing these operations/activities, as in the circuit modules shown in FIGS. 1, 2, 7-10 and 15. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, other compression, data access and data storage approaches may be implemented with similar functionality. Further, other types of radar-based signals, such as those involving the use of light, sound, ultrasound, or other energy that can be used to determine distance or Doppler effect for determining speed or phase differences between different sensor positions (e.g., to determine angular information), are processed in accordance with one or more embodiments. In addition, the various embodiments described herein may be combined in certain embodiments, and various aspects of individual embodiments may be implemented as separate embodiments. Such modifications do not depart from the true spirit and scope of various aspects of the invention, including aspects set forth in the claims.

What is claimed is:

1. An apparatus comprising:
   a radar transceiver configured and arranged to transmit radar signals and to receive reflections of the transmitted radar signals over a communication channel;
   a data compression circuit configured and arranged to determine a compression factor based on distance characteristics of the channel and a velocity of an object that causes the received reflections, and compress data representing the radar signals as a function of the determined compression factor; and
   a data generator circuit configured and arranged to generate an output signal including the compressed data.

2. The apparatus of claim 1, wherein the data compression circuit is configured and arranged to compress the data representing the received radar signals by, for each transmitted radar signal and a received reflection thereof, compressing the data via lossy compression based on the radar signal, path loss in the communication channel, distance between the radar transceiver and an object from which the radar signal is reflected, and expected compression loss during the compression of the data by the data compression circuit.

3. The apparatus of claim 1, wherein the data compression circuit is configured and arranged to determine the compression factor based upon distance characteristics, including Doppler Effect characteristics, of the transmitted radar signals.

4. The apparatus of claim 3, wherein the data compression circuit is configured and arranged to determine a velocity of an object from which the transmitted radar signals are received using the Doppler Effect characteristics, and to determine the compression factor based upon the determined velocity.

5. The apparatus of claim 3, wherein the data compression circuit is configured and arranged to use the Doppler Effect characteristics to determine a probability that an object from which the transmitted radar signals are received will collide with a vehicle to which the radar transceiver is coupled, and to determine the compression factor based upon the probability.

6. The apparatus of claim 1, wherein the data compression circuit is configured and arranged to
   determine a probability that an object from which the transmitted radar signals are received will collide with a vehicle to which the radar transceiver is coupled, based upon at least one of velocity of the object, distance of the channel, and angle at which the object is travelling relative to the vehicle, and
   determine the compression factor based upon the probability.

7. The apparatus of claim 1, wherein the communication channel extends from the radar transceiver to an object that provides the reflections of the transmitted radar signals and back to the transceiver, and the data generator circuit is further configured and arranged to generate the output signal using a communication protocol for a network that is separate from the communication channel over which the radar signals and reflections are transmitted and received, and to transmit the output signal on the network according to the protocol.

8. The apparatus of claim 1, wherein the data compression circuit is configured and arranged with the radar transceiver to transform the received reflections of the transmitted radar signals into data representing the radar signals and having data points based on a distance of respective objects from which the transmitted radar signals are reflected, relative to the radar transceiver.

9. The apparatus of claim 8, wherein the data compression circuit is configured and arranged with the radar transceiver to transform the received reflections of the transmitted radar signals by carrying out a Fast Fourier Transform (FFT) operation.

10. The apparatus of claim 9, wherein the data compression circuit is configured and arranged with the radar transceiver to compress the data based upon a mean absolute value and the variance of an absolute value of an output of the FFT operation.

11. The apparatus of claim 1, wherein the data compression circuit is configured and arranged to compress the data by transforming a quantization level of the data to a lower quantization level, for reflections of the transmitted radar signals from each of a plurality of objects, based on the distance of each object from the radar transceiver.

12. The apparatus of claim 1, wherein the data compression circuit is configured and arranged to determine path loss characteristics of the communication channel based upon a distance between the transceiver and objects from which the radar signals are reflected, and to compress the data based upon the determined path loss.

13. The apparatus of claim 1, wherein the data compression circuit is configured and arranged to compress the data using lossy compression, to predict an offset address based on the distance characteristics of the channel, and to store the compressed data using a transpose write operation and the predicted offset address.

14. The apparatus of claim 1, wherein the data compression circuit is configured and arranged to
   apply a Fourier transform to data representing the received reflections of the transmitted radar signals, therein providing transformed data,
   map the transformed data to a distance of objects from which the reflections are received, and
   for each transmitted radar signal,
      determine the compression factor and compress data representing the radar signal based upon the determined compression factor, and
      store the compressed data at memory addresses accessible by a vector of values for each memory access.

15. The apparatus of claim 14, wherein the data compression circuit is configured and arranged to store the compressed data at the memory addresses by storing the compressed data in a multidimensional array, with at least some of the compressed data stored in transposed form.

16. The apparatus of claim 1, wherein the data compression circuit is configured and arranged to determine the compression factor based on at least one of:
   a test signal transmitted via the radar transceiver, and
   a first portion of the received signal.

17. The apparatus of claim 1, wherein the data compression circuit is configured and arranged to store the compressed data in memory by allocating memory storage to different sets of data based upon the distance characteristics of the channel.

18. The apparatus of claim 1, wherein the data compression circuit is configured and arranged to, for each set of data corresponding to the radar signals:
   determine a probability that an object from which the transmitted radar signals are received will collide with a vehicle to which the radar transceiver is coupled, based upon at least one of velocity of the object, distance of the channel, and angle at which the object is travelling relative to the vehicle, and store compressed data in a memory by allocating memory storage to the set of data based upon the probability.

19. An article of manufacture comprising at least one non-transitory, tangible machine readable storage medium containing executable machine instructions that, when executed by a processor, cause the processor to carry out steps comprising:

transmitting signals and receiving reflections of the transmitted signals over a communication channel;

determining a compression factor based on distance characteristics of the channel and a velocity of an object that caused the reflections;

compressing data representing the signals as a function of the determined compression factor; and generating an output signal including the compressed data.

20. The article of manufacture of claim 19, wherein compressing the data representing the received signals includes, for each transmitted signal and a received reflection thereof, compressing the data based on the signal, path loss in the communication channel, distance between a transceiver from which the signals are transmitted and received and an object from which the signal is reflected, and expected compression loss during the compression of the data.

21. The article of manufacture of claim 19, wherein determining the compression factor includes determining the compression factor based upon distance characteristics including Doppler Effect characteristics of the transmitted signals.

22. The article of manufacture of claim 21, wherein the executable machine instructions further cause the processor to carry out the step of determining a velocity of an object from which the transmitted signals are received using the Doppler Effect characteristics, wherein determining the compression factor includes determining the compression factor based upon the determined velocity.

23. The article of manufacture of claim 21, wherein the executable machine instructions further cause the processor to carry out the step of using the Doppler Effect characteristics to determine a probability that an object from which the transmitted signals are received will collide with a vehicle at which the signals are transmitted and received, wherein determining the compression factor includes determining the compression factor based upon the probability.

24. The article of manufacture of claim 19, wherein the executable machine instructions further cause the processor to carry out the step of determining a probability that an object from which the transmitted signals are received will collide with a vehicle at which the signals are transmitted and received, based upon at least one of velocity of the object, distance of the channel, and angle at which the object is travelling relative to the vehicle, and wherein determining the compression factor includes determining the compression factor based upon the probability.

25. The article of manufacture of claim 19, wherein compressing the data includes transforming the received reflections of the transmitted signals into data representing the signals and having data points based on a distance of respective objects from which the transmitted signals are reflected, relative to a transceiver.

26. The article of manufacture of claim 19, wherein the executable machine instructions further cause the processor to carry out the step of determining path loss characteristics of the communication channel based upon a distance between a transceiver and objects from which the signals are reflected, wherein compressing the data includes compressing the data based upon the determined path loss.

27. The article of manufacture of claim 19, wherein the executable machine instructions further cause the processor to carry out the step of storing the compressed data in memory by allocating memory storage to different sets of data based upon the distance characteristics of the channel.

28. The article of manufacture of claim 19, wherein the executable machine instructions further cause the processor to carry out the steps of:

determining a probability that an object from which the transmitted signals are received will collide with a vehicle to which a transceiver is coupled, based upon at least one of velocity of the object, distance of the channel, and angle at which the object is travelling relative to the vehicle, and storing compressed data in memory by allocating memory storage to the set of data based upon the probability.

29. An apparatus comprising:

a radar transceiver configured and arranged to transmit radar signals and to receive reflections of the transmitted radar signals over a communication channel;

a data compression circuit configured and arranged to calculate a probability that an object from which the received reflections are received will collide with a vehicle to which the radar transceiver is coupled, and to determine the compression factor based upon the probability, and compress data representing the radar signals as a function of the determined compression factor; and a data generator circuit configured and arranged to generate an output signal including the compressed data.

* * * * *